Jan. 21, 1964 R. E. BRELLIER 3,118,716

CONNECTOR FOR PRINTED CIRCUIT BOARDS

Filed March 27, 1962

United States Patent Office 3,118,716
Patented Jan. 21, 1964

3,118,716

CONNECTOR FOR PRINTED CIRCUIT BOARDS

Roger Emile Brellier, Croissy-sur-Seine, France, assignor to Compagnie des Machines Bull (Société Anonyme), Paris, France Filed Mar. 27, 1962, Ser. No. 182,743
Claims priority, application France June 8, 1961
3 Claims. (Cl. 339—176)

Figure 2:
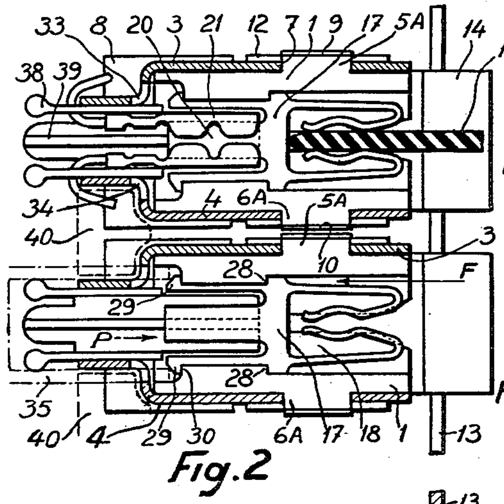

This invention relates to improvements in connectors for printed circuit boards or the like.

The term "printed circuit boards" as employed herein is to be understood as meaning electric circuits consisting at least partly of a deposit of electrical conductive material adhering to an insulating sheet or plate, regardless of the process employed for producing the said deposit.

Printed circuit boards are very widely employed not only in the construction of radio and television receiving apparatus, but also in the construction of large electronic computers, data-processing machines or like assemblies. In these machines, the printed circuit boards are generally prepared on rigid insulating plates capable of receiving also circuit elements such as transistors, diodes, resistances, etc. Generally speaking, the plates of printed circuit boards are provided, at least along one edge, with conductive (printed) surfaces called contact terminals, which are connected to the various circuits of the plates and are adapted to be engaged in a connector in which appropriately shaped and arranged contact members (called contacts) are disposed to effect a perfect contact with the said terminals of the printed circuit boards.

The electric contact established between the terminals of the printed circuit boards and the contacts of the connectors must be substantially insensitive to mechanical vibrations and to the oxidizing action of atmospheric agents. For this purpose, the contacts are so made as to exert on the terminals a strong pressure, but with such flexibility as not to be likely to damage the terminals when the printed circuits are repeatedly introduced into and withdrawn from the connectors.

In order to reduce the overall dimensions of electronic equipment, it is found necessary to provide printed circuit boards of increasing density, that is to say, in providing an ever increasing number of circuit boards per plate. Printed circuit boards are also employed which comprise a number of layers of circuits and a very large number of terminals.

The invention is concerned with connectors for the rational use of printed circuit boards having a large number of very closely spaced terminals.

One feature of the invention resides in that the contacts of the connectors are extremely flat and can be economically produced by simple cutting from a sheet or strip of appropriate metal.

Another feature of the invention resides in that the said contacts are detachable and are let into insulating separators in which they can be positioned and from which they can be withdrawn without removal of the said separators. The separators supporting the contacts are positioned in a connector by centering means which maintain them between precisely spaced uprights, the spacing between which corresponds to the spacing between the terminals of the printed circuits, despite possible differences in the thickness of the said insulating separators.

The uprights which support the separators in a connector are arranged to form an effective electrostatic shield between the rows of adjacent connector contacts and to provide between the said contacts guide passages in which the cables connected to contact springs plugged to contacts can be engaged and maintained.

Figure 6C:
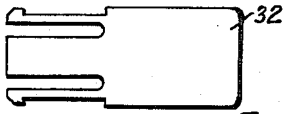
Figure 7B:
Figure 7A:
Figure 6B:
Figure 6A:
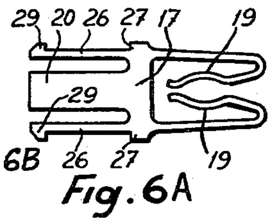
Figure 1:
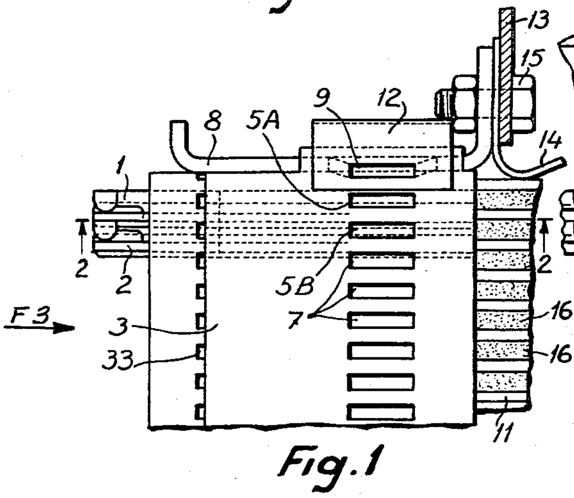
Figure 3:
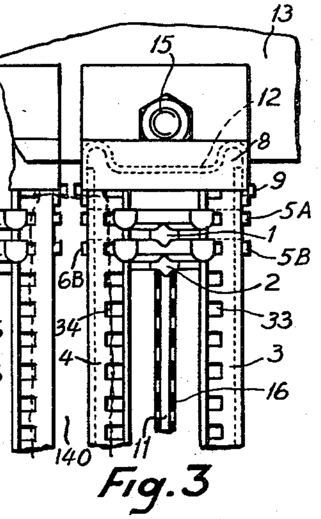
Figure 4:
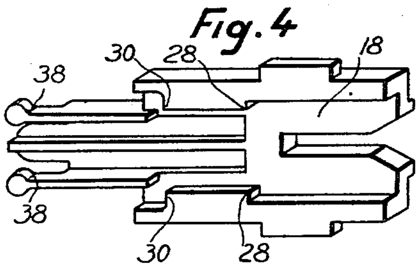
Figure 5:
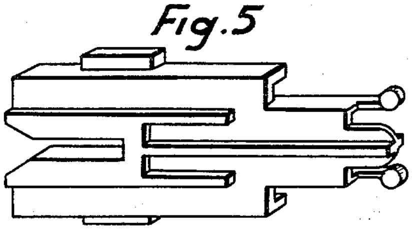

For a better understanding of the invention and to show how it may be performed, the same will now be described, by way of example, with reference to the accompanying drawings, which are drawn to an enlarged scale and in which:

FIGURE 1 is a side elevation of the upper portion of a connector comprising a number of insulating separators and a portion of a printed circuit board engaged in the said connector, FIGURE 2 is a sectional view through two connectors along the line 2—2 of FIGURE 1, FIGURE 3 is a view according to the direction of the arrow F3, of FIGURE 1, FIGURE 4 is a perspective view of an insulating separator from one side, FIGURE 5 is a perspective view of the separator from the other side, FIGURE 6A is an elevational view of a connector contact, FIGURE 6B is an end view of a connector contact, FIGURE 6C is an elevational view of a detachable abutment, FIGURE 7A is an elevational view of a pluggable contact spring, FIGURE 7B is an end view of a pluggable contact spring.

In the example which is about to be described, it will be assumed that the ends of a connector are theoretically identical and that the length of a connector in the majority of cases is a function of the width of the printed circuit boards which are to be engaged in the said connector. FIGURES 1 and 3 show only portions of connectors, but FIGURE 2 illustrates a section through two contiguous connectors in order to show the relative arrangements between adjacent connectors.

In FIGURES 1, 2 and 3, a portion of a printed circuit board is shown engaged in a connector. The printed circuit board comprises an insulating support plate 11 having deposits of conductive material 16 adhering thereto.

In FIGURES 1, 2 and 3, there are shown insulating separators 1 and 2 which are maintained between uprights 3 and 4 by means of lugs 5A, 6A and 5B, 6B engaged in apertures 7 in the said uprights. The said uprights are assembled together at each end of the connector and maintained in fixed spaced relationship by a spacing member 8 provided with two tongues 9 and 10 which are engaged respectively in apertures 7 in the ends of each upright. A spring clip 12 disposed above the uprights 3 and 4 and engaged on the tongues 9 and 10 maintains the said uprights fast with the spacing members 8. Each connector is fixed by bolts 15 at each of its ends to cross members 13 fast with a frame not shown. Disposed between each spacing member 8 and each cross member 13 is a guide strip 14 arranged to center a printed circuit board engaged in the connector.

Before the separators are fitted between the uprights of a connector, each separator may receive a contact 17 (FIGURES 6A and 6B) which is introduced into a cavity 18 (FIGURES 2 and 4) formed for this purpose in each separator. The contact 17 comprises (FIGURE 6A) two flexible contact branches 19 arranged to bear on the contact terminals of a printed circuit board engaged in a connector. A tongue 20 is provided to receive one or two pluggable contact springs 21 (FIGURES 2, 7A and 7B).

In a connector, each contact 17 is maintained in position in an insulating separator by means of two flexible engagement branches 26 (FIGURE 6). Each branch has in its base a boss 27 which bears, in a separator, against a shoulder 28. At the other end of the branch 26, a hook 29 bears against a shoulder 30 (FIGURES 2 and 4). Contacts 17 may also be positioned after the fitting of the separators 1 and 2 between the uprights of a connector. For this purpose, the hooks 29 and the tongue 20 of a contact 17 are introduced into the free space between two separators by pushing the contact in the direction of the arrow F (FIGURE 2). The shoulders 28 of the separator move the hooks 29 of the contact towards one another, which hooks can then be moved forward as far as the shoulders 30 behind which the said hooks can become lodged.

For various reasons, it may be found desirable to omit or replace a contact of a connector. To this end, the uprights of the connectors are formed with apertures 33 and 34 (FIGURES 1, 2 and 3), through which a fork-like tool 35 can be introduced. The said tool is represented by dash-dotted lines in FIGURE 2. When the tool is pushed into the apertures 33 and 34, the ends of the teeth of the said tool move the hooks 29 one towards the other and disengage them from the shoulders 30. At the same time, pressure is exerted on the tongue 20 in the direction of the arrow P (FIGURE 2) by means of a strip engaged between the separators, and the contact 17 can leave the connector. Before this operation is performed, it will be ensured that contact springs 21 are not plugged on to the tongue 20 of the contact to be withdrawn. It will be seen from FIGURE 2 that each contact spring in position on the tongue of a connector contact locks a corresponding hook and that under these conditions the extraction of a printed circuit board engaged in a connector cannot in any case result in withdrawal of a contact from the latter.

In order to prevent positioning of printed circuit boards in connectors which do not correspond to the said circuits, the connectors may be provided with detachable abutments 32 arranged to prevent the introduction of printed circuits not having recesses corresponding to the positions of the said abutments.

It is sometimes found desirable to modify some printed circuits and consequently to modify the arrangement of the abutments of the corresponding connectors in order to prevent positioning of "old-type" printed circuit boards. FIGURE 6C illustrates the outline of a detachable abutment 32. This member differs from a contact in that the branches 19 are replaced by an imperforate strip. The abutments may be positioned or withdrawn as stated with reference to the contacts, and the arrangement can therefore readily be modified in a connector.

In an electronic unit, the printed circuit boards are preferably disposed in a vertical plane in order to ensure rational ventilation of the said circuits.

The insulating separators 1 (FIGURES 2, 4 and 5) are provided with flexible branches 38 disposed on either side of a central guide portion 39. These branches make it possible (FIGURE 2) to wedge the cables of the tags plugged on to contacts and to reduce to some extent the influence on the adjacent contacts of manipulations of plugged tags.

The uprights of the connectors are arranged to define between contiguous connectors a channel 40 the approximate outline of which being indicated in dotted lines in FIGURES 2 and 3 in which the cables connected to plugged contact springs can be engaged and maintained.

Means for guiding and even locking that portion of printed circuit boards which is situated outside the connectors are provided. These guide means vary greatly according to requirements and will not be described since they do not in themselves form part of the invention.

I claim:

1. A connector comprising a plurality of flat detachable contacts disposed in parallel relationship to one another, maintained in regularly spaced cavities in a non-conductive support, and so disposed as to provide a connection between conductors having contact springs which are plugged on to the said contacts and conductive surfaces disposed regularly on either side of the edge of a printed circuit board engaged in the said connector, each contact being formed of sheet metal and provided on the one hand with two flexible contact branches disposed to bear against and to make contact with conductive surfaces of the printed circuit board, and on the other hand with two flexible engagement branches each having at their base a boss which bears against a shoulder provided at the inlet of the cavity in which the said contact is engaged, each engagement branch being provided at its end with a hook arranged to bear against a shoulder disposed at the outlet of said cavity, said engagement branches being positioned on either side of a contact tongue arranged to receive two contact springs in such manner that each contact spring plugged on to said tongue is positioned between the latter and an engagement branch in order to prevent disengagement of the hook of the said branch and to maintain the contact in the locked position in the cavity in which it is engaged.

2. A connector according to claim 1, wherein the non-conductive support comprises a plurality of insulating separators stacked between two uprights and each provided with a cavity to receive a contact, the said separators being maintained in fixed spaced relationship by means of tongues engaged in regularly spaced apertures in said uprights, the latter being assembled together at each end of the connector by means of spacing members also provided with tongues engaged in apertures disposed at the ends of the said uprights which are maintained against the spacing members by means of springs engaged with the tongues of said spacing members.

3. A connector according to claim 1, wherein one or more detachable abutments are disposed in said connector at points corresponding to points formed with recesses in the printed circuit boards engageable in the said connector, each abutment, formed by cutting from sheet metal, being provided on the one hand with a strip intended to engage in a recess formed in a printed circuit board, or to prevent the introduction into the connector of a printed circuit board not provided with a recess at that point, and on the other hand with two flexible engagement branches each having at their base a boss which bears against a shoulder provided at the inlet of a cavity in which the abutment is engaged, the said branches also being provided at their upper end with a hook arranged to bear against a shoulder disposed on the outlet of said cavity, which retains the said abutment in said connector.

References Cited in the file of this patent

UNITED STATES PATENTS

| | | |
|---|---|---|
| 2,691,147 | Sutton et al. | Oct. 5, 1954 |
| 2,894,241 | McKee | July 7, 1959 |
| 3,007,132 | Anderson | Oct. 31, 1961 |
| 3,031,640 | McKee | Apr. 24, 1962 |